United States Patent [19]

Pang et al.

[11] Patent Number: 4,858,182

[45] Date of Patent: Aug. 15, 1989

[54] HIGH SPEED ZERO POWER RESET CIRCUIT FOR CMOS MEMORY CELLS

[75] Inventors: Roland H. Pang, Plano; Edison H. Chiu, Richardson, both of Tex.

[73] Assignee: Texas Instruments Incorporated, Dallas, Tex.

[21] Appl. No.: 944,643

[22] Filed: Dec. 19, 1986

[51] Int. Cl.⁴ .................. G11C 7/00; G11C 11/40
[52] U.S. Cl. .............................. 365/156; 365/218; 365/226; 365/190
[58] Field of Search ............... 365/189, 203, 218, 154, 365/156, 190, 226, 227, 228, 229, 129

[56] References Cited

U.S. PATENT DOCUMENTS 3,757,313 9/1973 Hines et al. ................. 365/226
4,418,401 11/1983 Bansal ......................... 365/95
4,489,404 12/1984 Yasuoka ....................... 365/190
4,567,578 1/1986 Cohen et al. ................. 365/218

FOREIGN PATENT DOCUMENTS 0189700 8/1986 European Pat. Off. ........... 365/218
0064686 5/1980 Japan ................................ 365/226

Primary Examiner—Stuart N. Hecker
Assistant Examiner—Glenn A. Gossage
Attorney, Agent, or Firm—George L Craig; James T. Comfort; Melvin Sharp

[57] ABSTRACT

A reset circuit for a CMOS memory array is disclosed wherein the voltage supply for the standard six transistor memory cell is replaced by a pair of parallel connected transistors disposed between a fixed voltage source and the memory cell. The transistors are controlled by the reset signal and are complementary in that one is n-channel and the other is p-channel. The n-channel transistor is sized to prevent excess current flow to the memory cells to prevent an excessive charge build up therein for a logical "1" representation. In addition, the n-channel transistor provides a Vtn drop thereacross to prevent current flow in the memory cells during reset.

9 Claims, 2 Drawing Sheets

HIGH SPEED ZERO POWER RESET CIRCUIT FOR CMOS MEMORY CELLS

BACKGROUND OF THE INVENTION

1. Field of the Invention

This invention relates to reset circuits for single chip memory cells and, more specifically, to a reset circuit for CMOS memory cells capable of operation at very high speed and very low power.

2. Brief Description of the Prior Art

Reset circuits as presently known in the art for use in conjunction with CMOS memory cells are of relatively low operating speed, utilize a relatively large amount of chip real estate and dissipate a relatively large amount of power. CMOS memory cells of the prior art, as shown in FIG. 1, normally include six transistors, two of the transistors, Q1 and Q2, being n-channel pass transistors and being controlled via their gate electrodes by one of the word lines of the memory cell array. Such memory cells are also composed of two pairs of cross-coupled transistors, each pair including series connected n-channel pull down and p-channel pull up transistors. The equivalent circuit of the memory cells is a pair of inverters connected in parallel but operating in opposite directions. The pass transistors are coupled via their source to one of the bit line or bit line bar. These memory cells have data read thereinto to latch a particular logical state therein which can be read out later in known manner.

A problem arises in that, when the memory cells are to be reset, all of the word lines must be turned on and the bit lines are placed in a predetermined reset state. If, for example, all of the cells in a column store a logical "1" and these cells are all to be reset to a logical "0", during reset, the cells are actually driving the bit lines rather than vice versa. In order to remedy this problem in the prior art, it has been necessary that the reset transistors M1 and M2 be of very large size in order to supply a large amount of current and that these transistors be turned on for a substantial period of time in order to insure that the cells are in fact reset and that the driving power of the cells to be reset is neutralized and overpowered by the resetting current. It is readily apparent that the greater the number of cells in a column, the greater is the amount of current required to reset the memory array and, accordingly, the reset transistors must therefore be very large in order to over power the memory cells. These remedies, while providing the intended result, actually are a trade-off in that they increase the amount of chip real estate which must be used by the reset transistors and which also will create a very large transient current during reset. Also, the increased time used for reset slows down the speed of chip operation.

In addition, when a memory cell is accessed, the drain nodes of the p-channel and n-channel transistors, noted as A or B, for example, in FIG. 1, is at a voltage level Vcc - Vth (the threshold voltage drop through the pass transistor Q1 or Q2 or the threshold voltage thereof). Transistors Q1 and Q2 have their bulk tied to ground whereas their source nodes are not at the same potential, producing the body effect on said transistors Q1 and Q2. The absolute value of the threshold voltage of transistor Q2, being process dependent, may therefore by higher than that of transistor MP2 or MP1. Accordingly, transistor MP1 will be slightly turned on since node A drops below the threshold of the p-channel transistor MP1. For this reason, the cell will have a d-c current flow from Vcc through transistors MP2 and MN2 to ground. The same analysis is true for transistors Q1, MP2 and MN2. The above current flow will be small, however since such current flow can take place in many or all of the cells, the ultimate current can be high and dissipate a great deal of power.

SUMMARY OF THE INVENTION

In accordance with the present invention, the above noted shortcomings of the prior art are minimized and there is provided a reset circuit for CMOS memory arrays, which utilizes minimum chip real estate, operates with relatively low power consumption, avoids the possibility of unwanted turn-on of memory transistors and improves operating speed over prior art memory arrays of the type shown in FIG. 1.

Briefly, in accordance with the present invention, there is provided a CMOS memory array which is identical to that of the prior art except that the voltage applied across the pull up and pull down transistors of each memory cell is a modified form of Vcc, denoted as Vcc2 which is a function of Vcc, an additional circuit and the reset signal. When the reset signal is provided, it turns on one of a pair of transistors (one an n-channel and one a p-channel) forming said additional circuit between Vcc and the p-channel transistors of each memory cell and turns off the other transistor therebetween, thereby providing Vcc2 which is Vcc minus the threshold voltage drop across the n-channel transistor turned on by the reset signal. Since the n-well of each of the p-channel pull up transistors is tied to the Vcc2 signal, there is no body effect because the bulk of each of the pull up transistors is tied to its source (Vbs=0). Accordingly, the additional circuit operates as a level shift for the voltage applied to the cell and also limits the current that can be applied thereto and to the bit line during reset, since the size of the n-channel transistor of the additional circuit can be adjusted in fabrication. Since the memory cells now have limited power, it is not necessary that the reset transistors be as large as in the prior art to overpower the cells during reset and/or that they be kept on for a long period for usual sized reset circuits, thereby providing the real estate and speed advantages as noted hereinabove. It is understood that the time required for proper reset is a function of the size of the reset circuit. Also, due to the Vcc2 voltage applied to the drain node of the p-channel memory transistors, the voltage at node B is at Vcc2 and the voltage at node A is Vss, thereby turning off the p-channel memory transistor and avoiding the d-c current during reset as found in the prior art as noted hereinabove.

DESCRIPTION OF THE PREFERRED EMBODIMENT

Figure 1:
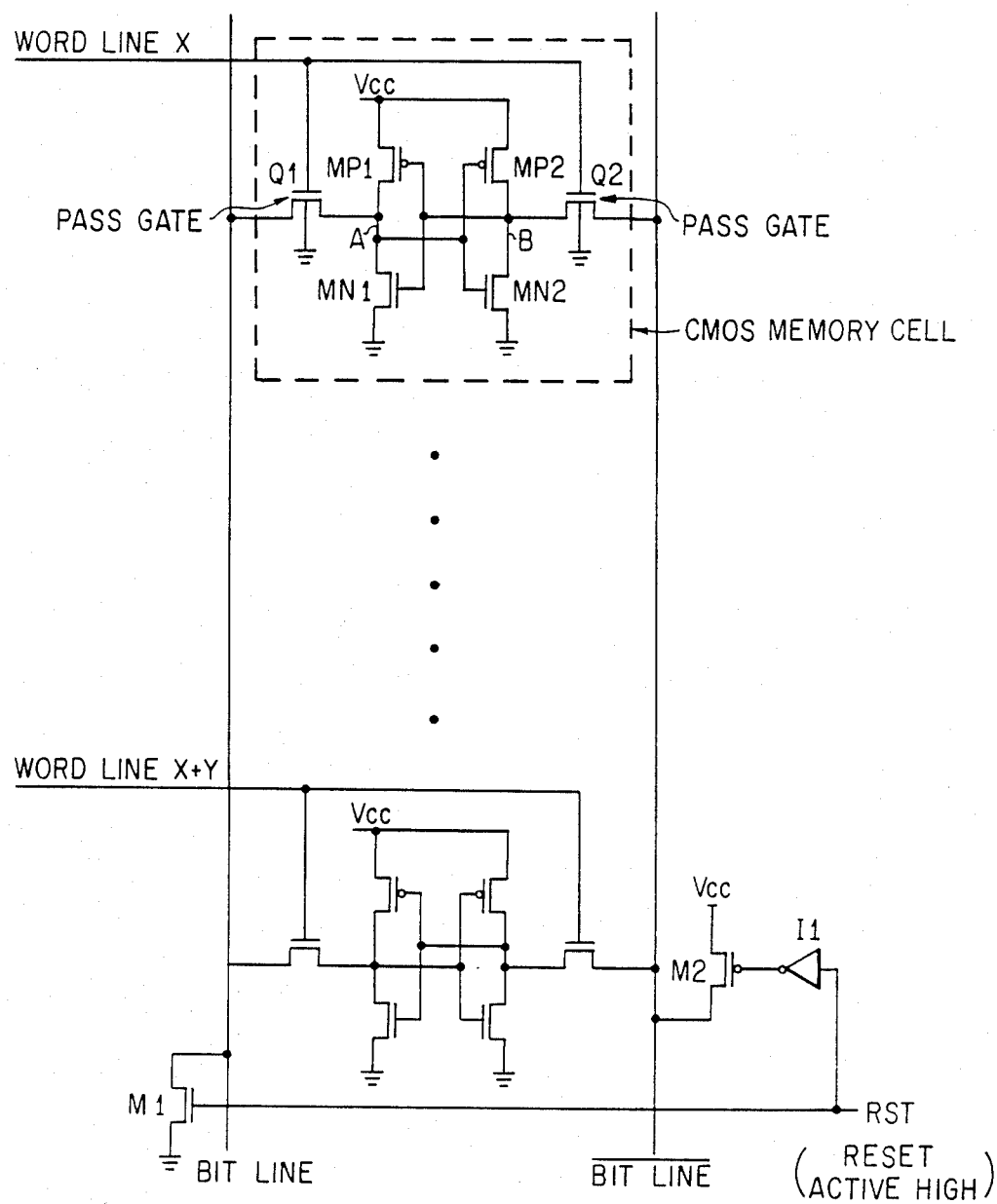
FIG. 1 is a circuit diagram of a portion of a CMOS memory array with reset circuitry of the prior art.

Referring first to FIG. 1, there are shown two CMOS memory cells of a prior art n-cell memory array. Each memory cell includes a pair of n-channel pull down transistors MN1 and MN2 and a pair of p-channel pull up transistors MP1 and MP2. The transistors MP1 and MN1 are coupled in series between Vcc and ground and transistors MP2 and MN2 are similarly connected. The gates of transistors MP1 and MN1 are commonly coupled to node B which is the junction of the drains of transistors MP2 and MN2 and the gates of transistors MP2 and MN2 are commonly coupled to node A which is the junction of the drains of transistors MP1 and MN1 in cross coupled connection of standard design. As stated above, the circuit arrangement of the memory cell transistors MP1, MN1, MP2 and MN2 is that of a pair of parallel connected CMOS inverters which are cross coupled or going in oppoiste directions.

An N-channel pass transistor Q1 with its bulk grounded, as shown by the ground symbol, is coupled between the commonly connected gates of transistors MP2 and MN2 (i.e. the node A) and the bit line, the gate thereof being coupled to the word line X. A second N-channel pass transistor Q2 with its bulk grounded is coupled between the commonly connected gates of transistors MP1 and MN1 (i.e. the node B) and the bit line bar, the gate therefore being coupled to the word line X. As is known in the art, the remaining memory cells are coupled to the bit lines and bit lines bar in the same manner as well as to a different word line, such as exemplified by the X+Y word line.

The reset circuit is composed of a pair of transistors, one, M1, being an N-channel pull down device coupled between the bit line and ground and the second, M2, being a P-channel pull up device coupled between the bit line bar and Vcc. The reset (RST) signal is coupled to the gate of transistor M1 directly and through an inverter I1 to the gate of transistor M2.

In operation, for reset, with all of the word lines at Vcc voltage level, the pass transistors Q1 and Q2 are turned on. During this period, when the reset signal RST goes high, the reset transistors M1 and M2 are turned on, thereby causing the pull down transisor M1 to attempt to pull down the bit line to the Vss, reference or ground level whereas the pull up transistor M2 attemps to pull the bit line bar up to Vcc. The memory cells in the same column will be reset to the same known state (i.e., a logical "1" or a logical "0") by the voltage level on the bit line or bit line bar which is written into the memory cell through the pass transistors Q1 and Q2. Therefore, the gates of transistors MP1 and MN1 will be high and the gates of transistors MP2 and MN2 will be low to provide reset of the cell to a logical "0" wherein node A is low and node B is high.

The problem with this circuit is that, when the memory calls are being reset, and assuming that all or most of the cells in a particular column are storing a logical "1" before the reset (i.e., the junction A of transistors MP1 and MN1 is at about Vcc and the junction B of transistors MP2 and MN2 is at about Vss and both pass gates Q1 and Q2 are off), all of the word lines are at Vcc to enable pass gates of each cell and the bit line is driven to a voltage level off Vcc−Vtn (where Vtn is the threshold voltage of the n-channel pass transistors) by transistor MP1 of each cell. On the other hand, the bit bar line is being pulled down to Vss by the pull down transistor MN2 of each cell. In order to reset or flip all of the cells to store a logic "0", the reset transistors M1 and M2 must overpower the conditions in the bit line and bit bar line set by the memory cells in the same column. That is, the transistor M1 tries to overpower the transistor MP1 by pulling the bit line to Vss and, at the same time the transistor M2 is trying to overpower the transistor MN2 by raising the level of the bit bar line to Vcc.

Depending upon how many memory cells are in the same column (usually 32, 64 or 128 cells), the size of the reset transistors M1 and M2 must be large enough to counteract the signal at the nodes A and B to flip all of the cells to the opposite logic state. This operation will require and create large transient current and is very slow to insure flipping of all the memory cells. Therefore, the reset cycle is long with relatively large reset pulse width.

A second problem occurs when the memory cells are being reset to a logical "0". If the voltage of the reset signal is held to Vcc, then the node B of the drains of transistors MP2 and MN2 is at Vcc−Vtn (a threshold voltage) level which may be above the threshold of the transistor MP1. The memory cells will then have a d-c current flow therethrough from Vcc to Vss during reset, this unwanted d-c current drain during reset being preferably eliminated or minimized.

Figure 2:
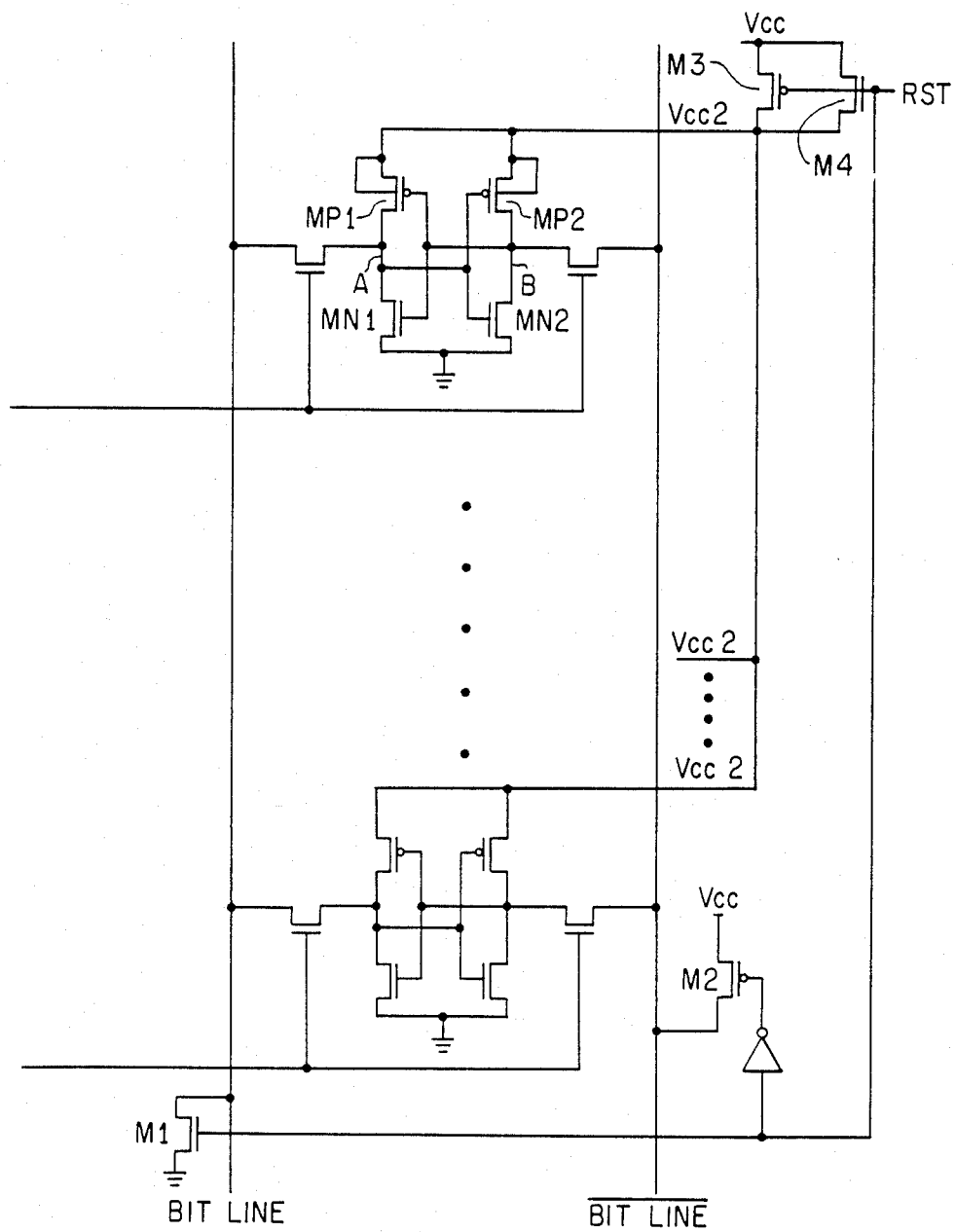
FIG. 2 is a circuit diagram as in FIG. 1 with reset circuitry in accordance with the present invention.

With reference to FIG. 2, there is shown the improved reset circuit in accordance with the present invention, wherein like character references depict like circuit elements of FIG. 1.

In accordance with the present invention as shown in FIG. 2, there is provided a CMOS memory array which is identical to that of the prior art as depicted in FIG. 1 except that the prior art memory array is now connected to a reset circuit interposed between the supply voltage (Vcc) and example transistors MP1 and MP2 of the memory array. The reset circuit shifts the voltage level applied across transistors MP1 and MP2 from Vcc to Vcc2 such that the array is reset under a zero power current limited condition. The additional circuit includes a p-channel transistor M3 connected between Vcc and the common sources of transistors MP1 and MP2 and an n-channel transistor M4 connected between Vcc and the common sources of transistors MP1 and MP2. The gates of transistors M3 and M4 are driven by the reset signal RST.

When the reset signal is initiated, it provides an RST signal of Vcc voltage level to the gates of transistors M3 and M4 and turns on transistor M4 and turns off transistor M3. Current will then flow from Vcc, through transistor M4 to tansistors MP1 and MP2 of each cell. The voltage at the source node of transistor M4 and the sources of transistors MP1 and MP2 is denoted Vcc2 and is equal to Vcc−Vtn, wherein Vtn is the threshold voltage of transistor M4. Transistor M4 accordingly serves as a voltage level shift device during the reset cycle. Also, transistor M4 operates as a current limiter, the maximum current source capability of the Vcc2 signal being limited by the physical size of transistor M4. Therefore, the maximum current available for the memory cells of the memory array is limited.

With the RST signal high and all of the word lines at the Vcc voltage level, the reset transistors M1 and M2 can now reset all of the memory cells effortlessly because the bit line and the bit line bar are no longer driven by the memory cells due to the limitation on current capacity of transistor M4 and the reduced voltage (Vcc2) across the memory cell. The bit line and the bit line bar are driven by transistors M1 and M2, as explained with reference to FIG. 1 hereinabove, and the signal levels on the bit line and the bit line bar are then written into the memory cells to complete the reset operation. There is no large transient current and the reset cycle can be operated at very high speed. Also, during the reset cycle, both node B and Vcc2 are at Vcc−Vtn. Transistor MP1 of each cell therefore completely turns off and there is no d-c current flow through the memory cells. This is because the n-well of each of the p-channel pull up transistors MP1 and MP2 is tied to the Vcc2 signal wherein there is no body effect because the bulk of the p-channel transistor MP1 or MP2 and its source node are tied together. After the reset cycle, the RST signal is brought back to Vss, transistor M3 turns on and transistor M4 turns off. The Vcc2 line will then go close to Vcc and transistors M1 and M2 will turn off to permit the normal memory array function to be resumed.

Accordingly, the additional circuit operates as a level shift for the voltage applied to the cell and also limits the current that can be applied thereto and to the bit line during reset, since the size of the n-channel transistor of the additional circuit can be adjusted in fabrication. Since the memory cells now have limited power in the form of the maxiumum charge that can be stored therein, it is not necessary that the reset transistors be as large as in the prior art to overpower the cells during reset and/or that they be kept on for a long period, thereby providing the real estate and speed advantages as noted hereinabove. Also, due to the Vcc2 voltage level at the p-channel memory transistors MP1 and MP2, thereby avoiding the d-c current during reset as found in the prior art as noted hereinabove.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A reset circuit for a memory array having at least one memory cell comprising:
   (a) a source of reset signals;
   (b) a source of supply voltage Vcc applied to said memory cells; and
   (c) first and second parallel-connected transistors coupled between said supply voltage source and each said memory cell in said memory array, said first transistor turned off and said second transistor turned on in the presence of said reset signals, said second transistor shifting said supply voltage downward to Vcc2 in the presence of said reset signals providing a current limited zero power condition in said cells of said array during reset.

2. A reset circuit as set forth in claim 1 wherein said memory cell is a CMOS memory cell.

3. A reset circuit as set forth in claim 1 wherein said first transistor is a p-channel transistor and said second transistor is an n-channel transistor.

4. a reset circuit as set forth in claim 1 wherein said first transistor has a minimal threshold voltage drop thereacross relative to said second transistor.

5. A reset circuit as set forth in claim 1 wherein said second transistor is sized to provide a predetermined maximum current flow.

6. A reset circuit for a CMOS memory array comprising:
   (a) a source of reset signals;
   (b) a source of supply voltage applied to said CMOS memory array;
   (c) a first transistor coupled between said source of supply voltage and said memory array, said first transistor having a minimal threshold voltage drop thereacross when a low voltage signal is applied to an input of said first transistor; and
   (d) a second transistor parallel-connected to said first transistor and coupled between said source of supply voltage and said memory array, said second transistor shifting the source of supply voltage to a lower level applied to said CMOS memory array when said reset signal is applied to an input of said second transistor.

7. The reset circuit of claim 6 wherein said first transistor is a p-channel transistor.

8. The reset circuit of claim 6 wherein said second transistor is an n-channel transistor.

9. The reset circuit of claim 6 wherein said second transistor is sized to provide a predetermined maximum current flow.

* * * * *